United States Patent
Radigan et al.

(10) Patent No.: US 7,718,546 B2
(45) Date of Patent: May 18, 2010

(54) METHOD FOR FABRICATING A 3-D INTEGRATED CIRCUIT USING A HARD MASK OF SILICON-OXYNITRIDE ON AMORPHOUS CARBON

(75) Inventors: Steven J. Radigan, Fremont, CA (US); Michael W. Konevecki, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 254 days.

(21) Appl. No.: 11/769,027

(22) Filed: Jun. 27, 2007

(65) Prior Publication Data
US 2009/0004786 A1      Jan. 1, 2009

(51) Int. Cl.
*H01L 21/469* (2006.01)

(52) U.S. Cl. .............. 438/758; 438/624; 438/633; 438/638; 257/328; 257/E27.02; 257/E27.022; 257/E27.031; 257/E27.038; 257/E27.039; 257/7

(58) Field of Classification Search .......... 438/624, 438/633, 638, 758, FOR. 350
See application file for complete search history.

(56) References Cited

U.S. PATENT DOCUMENTS

| | | | | |
|---|---|---|---|---|
| 4,646,266 | A * | 2/1987 | Ovshinsky et al. | 365/105 |
| 5,751,012 | A * | 5/1998 | Wolstenholme et al. | 257/5 |
| 5,835,396 | A * | 11/1998 | Zhang | 365/51 |
| 5,915,167 | A | 6/1999 | Leedy | |
| 5,969,380 | A * | 10/1999 | Seyyedy | 257/295 |
| 6,051,851 | A * | 4/2000 | Ohmi et al. | 257/185 |
| 6,077,729 | A * | 6/2000 | Harshfield | 438/128 |
| 6,087,269 | A * | 7/2000 | Williams | 438/735 |
| 6,185,122 | B1 * | 2/2001 | Johnson et al. | 365/103 |
| 6,486,065 | B2 * | 11/2002 | Vyvoda et al. | 438/690 |
| 6,534,841 | B1 * | 3/2003 | Van Brocklin et al. | 257/530 |
| 6,541,312 | B2 * | 4/2003 | Cleeves et al. | 438/131 |
| 6,559,516 | B1 * | 5/2003 | Van Brocklin et al. | 257/530 |

(Continued)

OTHER PUBLICATIONS

International Search Report and Written Opinion of the International Searching Authority, dated Sep. 25, 2008, PCT Appl. No. PCT/US2008/068307.

(Continued)

*Primary Examiner*—Fernando L Toledo
*Assistant Examiner*—Ankush K Singal
(74) *Attorney, Agent, or Firm*—Vierra Magen Marcus & DeNiro LLP

(57) ABSTRACT

A method for fabricating a 3-D monolithic memory device. Silicon-oxynitride ($Si_xO_yN_z$) on amorphous carbon is used an effective, easily removable hard mask with high selectivity to silicon, oxide, and tungsten. A silicon-oxynitride layer is etched using a photoresist layer, and the resulting etched $Si_xO_yN_z$ layer is used to etch an amorphous carbon layer. Silicon, oxide, and/or tungsten layers are etched using the amorphous carbon layer. In one implementation, conductive rails of the 3-D monolithic memory device are formed by etching an oxide layer such as silicon dioxide ($SiO_2$) using the patterned amorphous carbon layer as a hard mask. Memory cell diodes are formed as pillars in polysilicon between the conductive rails by etching a polysilicon layer using another patterned amorphous carbon layer as a hard mask. Additional levels of conductive rails and memory cell diodes are formed similarly to build the 3-D monolithic memory device.

10 Claims, 14 Drawing Sheets

U.S. PATENT DOCUMENTS

| | | | |
|---|---|---|---|
| 6,602,502 B1 | 8/2003 | Strahilevitz | |
| 6,653,733 B1 * | 11/2003 | Gonzalez et al. | 257/758 |
| 6,664,639 B2 * | 12/2003 | Cleeves | 257/774 |
| 6,670,659 B1 * | 12/2003 | Gudesen et al. | 257/295 |
| 6,677,220 B2 * | 1/2004 | Van Brocklin et al. | 438/467 |
| 6,689,644 B2 * | 2/2004 | Johnson | 438/131 |
| 6,703,652 B2 * | 3/2004 | Van Brocklin et al. | 257/209 |
| 6,704,235 B2 | 3/2004 | Knall et al. | |
| 6,768,185 B2 * | 7/2004 | Cleeves et al. | 257/529 |
| 6,780,683 B2 * | 8/2004 | Johnson et al. | 438/128 |
| 6,781,858 B2 * | 8/2004 | Fricke et al. | 365/51 |
| 6,839,263 B2 * | 1/2005 | Fricke et al. | 365/63 |
| 6,850,432 B2 * | 2/2005 | Lu et al. | 365/163 |
| 6,853,049 B2 * | 2/2005 | Herner | 257/529 |
| 6,919,168 B2 | 7/2005 | Hwang et al. | |
| 6,927,178 B2 | 8/2005 | Kim et al. | |
| 6,936,539 B2 | 8/2005 | Yin et al. | |
| 6,946,719 B2 * | 9/2005 | Petti et al. | 257/530 |
| 6,952,030 B2 | 10/2005 | Herner et al. | |
| 7,005,350 B2 | 2/2006 | Walker et al. | |
| 7,012,021 B2 * | 3/2006 | Ang et al. | 438/634 |
| 7,033,960 B1 | 4/2006 | You et al. | |
| 7,049,153 B2 * | 5/2006 | Agarwal et al. | 438/3 |
| 7,064,078 B2 * | 6/2006 | Liu et al. | 438/717 |
| 7,091,529 B2 * | 8/2006 | Knall et al. | 257/209 |
| 7,129,180 B2 | 10/2006 | Sandhu et al. | |
| 7,129,538 B2 * | 10/2006 | Lee et al. | 257/321 |
| 7,132,335 B2 * | 11/2006 | Ilkbahar et al. | 438/286 |
| 7,238,607 B2 * | 7/2007 | Dunton et al. | 438/626 |
| 7,319,053 B2 * | 1/2008 | Subramanian et al. | 438/131 |
| 7,329,565 B2 * | 2/2008 | Herner | 438/131 |
| 7,332,262 B2 * | 2/2008 | Latchford et al. | 430/311 |
| 7,410,838 B2 * | 8/2008 | Ang | 438/131 |
| 7,433,227 B2 * | 10/2008 | Campbell et al. | 365/163 |
| 7,525,137 B2 * | 4/2009 | Walker et al. | 257/278 |
| 7,618,850 B2 * | 11/2009 | Kumar et al. | 438/131 |
| 2001/0055838 A1 * | 12/2001 | Walker et al. | 438/129 |
| 2002/0001778 A1 * | 1/2002 | Latchford et al. | 430/313 |
| 2002/0075719 A1 * | 6/2002 | Johnson et al. | 365/130 |
| 2002/0106838 A1 * | 8/2002 | Cleeves et al. | 438/131 |
| 2002/0140051 A1 * | 10/2002 | Knall et al. | 257/530 |
| 2003/0087484 A1 | 5/2003 | Vyvoda et al. | |
| 2003/0107311 A1 | 6/2003 | Radigan et al. | |
| 2003/0155569 A1 * | 8/2003 | Lee | 257/20 |
| 2003/0173643 A1 * | 9/2003 | Herner | 257/530 |
| 2004/0000679 A1 * | 1/2004 | Patel et al. | 257/216 |
| 2004/0023475 A1 * | 2/2004 | Bonser et al. | 438/585 |
| 2004/0089917 A1 * | 5/2004 | Knall et al. | 257/530 |
| 2004/0188798 A1 * | 9/2004 | Knall et al. | 257/530 |
| 2004/0196688 A1 * | 10/2004 | Yamamoto et al. | 365/154 |
| 2004/0207001 A1 * | 10/2004 | Kouznetsov et al. | 257/314 |
| 2005/0026334 A1 * | 2/2005 | Knall | 438/128 |
| 2005/0098800 A1 | 5/2005 | Herner et al. | |
| 2005/0214694 A1 * | 9/2005 | Hong et al. | 430/323 |
| 2006/0038212 A1 * | 2/2006 | Moore et al. | 257/295 |
| 2006/0054962 A1 * | 3/2006 | Dunton et al. | 257/313 |
| 2006/0128153 A1 | 6/2006 | Dunton et al. | |
| 2006/0157683 A1 | 7/2006 | Scheuerlein | |
| 2006/0183282 A1 | 8/2006 | Raghuram | |
| 2006/0222962 A1 | 10/2006 | Chen et al. | |
| 2006/0231524 A1 * | 10/2006 | Liu et al. | 216/41 |
| 2006/0273404 A1 * | 12/2006 | Scheuerlein | 257/390 |
| 2007/0082296 A1 * | 4/2007 | Yang et al. | 430/311 |
| 2007/0105284 A1 * | 5/2007 | Herner | 438/131 |
| 2007/0111467 A1 * | 5/2007 | Kim | 438/424 |
| 2007/0272913 A1 * | 11/2007 | Scheuerlein | 257/4 |
| 2007/0284656 A1 * | 12/2007 | Radigan et al. | 257/328 |
| 2008/0064165 A1 * | 3/2008 | Kim et al. | 438/264 |
| 2008/0254615 A1 * | 10/2008 | Dunton et al. | 438/631 |
| 2008/0305641 A1 * | 12/2008 | Kiehlbauch | 438/703 |

OTHER PUBLICATIONS

Vogt, Mirko et al., Introduction of PECVD Carbon Hardmasks APF(TM) for sub-90nm DRAM Technology, ECS, 2004.

Notification Concerning Transmittal of Copy of International Preliminary Report on Patentability and Written Opinion, dated Jan. 14, 2010, PCT Appl. No. PCT/US2008/068307.

* cited by examiner

← C, 2125

← W, 2120
← TiN, 2115
← AF, 2110
← Poly, 2105
← TiN, 2100

← W, 2120
← TiN, 2115
← AF, 2110
← Poly, 2105
← TiN, 2100

Dielectric, 2500
W, 2120
TiN, 2115
AF, 2110
Poly, 2105
TiN, 2100

Dielectric, 2600
W, 2630
TiN, 2625
AF, 2620
Poly, 2615
TiN, 2610
W, 2605
TiN, 2600
W, 2120
TiN, 2100

US 7,718,546 B2

METHOD FOR FABRICATING A 3-D INTEGRATED CIRCUIT USING A HARD MASK OF SILICON-OXYNITRIDE ON AMORPHOUS CARBON

BACKGROUND OF THE INVENTION

1. Field of the Invention

The present invention relates to fabricating a 3-D integrated circuit.

2. Description of the Related Art

Due to the high cost of silicon real estate and the need to create ever smaller memory devices, monolithic 3-D memory devices have become increasingly popular. Such devices can include multiple levels of interconnected memory cells. Examples of this technology can be found in U.S. 2005/0098800, titled "Nonvolatile memory cell comprising a reduced height vertical diode," published May 12, 2005, and U.S. Pat. No. 6,952,030, titled "High-density three-dimensional memory cell", issued Oct. 4, 2005, both of which are incorporated herein by reference. In such devices, the memory cells can be formed as diodes in polysilicon layers, while conductive rails which interconnect the memory cells can be formed by etching oxide layers and depositing a conductive material. However, various difficulties have been encountered in etching the polysilicon and oxide layers. For example, conventional hard mask techniques have not had sufficient etch resistance to last for the duration of the etch. As a result, such hard mask techniques can exacerbate line etch roughness, obscure underlying alignment and overlay marks, and be difficult to integrate or remove. As 3-D monolithic integrated circuits push minimum feature sizes and etch and fill aspect ratios to the limit, presenting very demanding requirements, conventional hard mask techniques have been found to be inadequate.

SUMMARY OF THE INVENTION

The present invention addresses the above and other issues by providing a method for fabricating a 3-D monolithic memory device in which etching of oxide and polysilicon layers is improved.

In one embodiment, a method for fabricating a 3-D monolithic memory device includes patterning a first silicon-oxynitride layer in a layered structure to provide a first patterned silicon-oxynitride layer, where the layered structure includes a first amorphous carbon layer below the first silicon-oxynitride layer, and a first oxide layer below the first amorphous carbon layer. The method further includes patterning the first amorphous carbon layer using the first patterned silicon-oxynitride layer to provide a first patterned amorphous carbon layer, patterning the first oxide layer using the first patterned amorphous carbon layer to provide a first patterned oxide layer, and forming a first set of conductive rails in the first patterned oxide layer, the first set of conductive rails are in a particular level of the 3-D monolithic memory device.

In another embodiment, a method for fabricating a 3-D monolithic memory device includes patterning a first silicon-oxynitride layer in a layered structure to provide a first patterned silicon-oxynitride layer, where the layered structure includes a first amorphous carbon layer below the first silicon-oxynitride layer, and a first polycrystalline layer below the first amorphous carbon layer. The method further includes patterning the first amorphous carbon layer using the first patterned silicon-oxynitride layer to provide a first patterned amorphous carbon layer, and patterning the first polycrystalline layer using the first patterned amorphous carbon layer to provide a first plurality of pillars which are diodes in a first level of a 3-D monolithic memory device.

In another embodiment, a method for fabricating a 3-D monolithic memory device includes, in a layered structure, transferring a common pattern to a first silicon-oxynitride layer and a first amorphous carbon layer below the first silicon-oxynitride layer, to provide, together, first patterned silicon-oxynitride and amorphous carbon layers, and patterning a first oxide layer below the first amorphous carbon layer using the first patterned silicon-oxynitride and amorphous carbon layers together to provide a first patterned oxide layer.

In another embodiment, a method for fabricating a 3-D monolithic memory device includes, in a layered structure, transferring a common pattern to a first silicon-oxynitride layer and a first amorphous carbon layer below the first silicon-oxynitride layer, to provide, together, first patterned silicon-oxynitride and amorphous carbon layers, and patterning a first polycrystalline layer below the first amorphous carbon layer using the first patterned silicon-oxynitride and amorphous carbon layers together to provide a first patterned polycrystalline layer.

In another embodiment, a method for fabricating a 3-D monolithic memory device includes forming multiple levels of diodes, one level after another, in a 3-D monolithic memory device, where each level includes a plurality of pillars formed in a polycrystalline layer, the pillars are electrically coupled from above and below to conductive rails, each level of pillars is formed by patterning an associated polycrystalline layer using an associated hard mask, the associated hard mask is patterned using a silicon-oxynitride layer.

In another embodiment, a method for fabricating a 3-D monolithic memory device includes forming multiple levels of diodes, one level after another, in a 3-D monolithic memory device, where each level includes a plurality of pillars formed in polycrystalline, the pillars are electrically coupled from above and below to conductive rails, each level of conductive rails is formed by patterning an associated oxide layer using an associated hard mask, the associated hard mask is patterned using a silicon-oxynitride layer.

BRIEF DESCRIPTION OF THE DRAWINGS

FIG. 14b depicts a top view of the layered structure of FIG. 14a.

FIG. 20 depicts a top view of the layered structure of FIG. 19a.

DETAILED DESCRIPTION

The present invention provides a method for fabricating a 3-D memory device.

Figure 1:
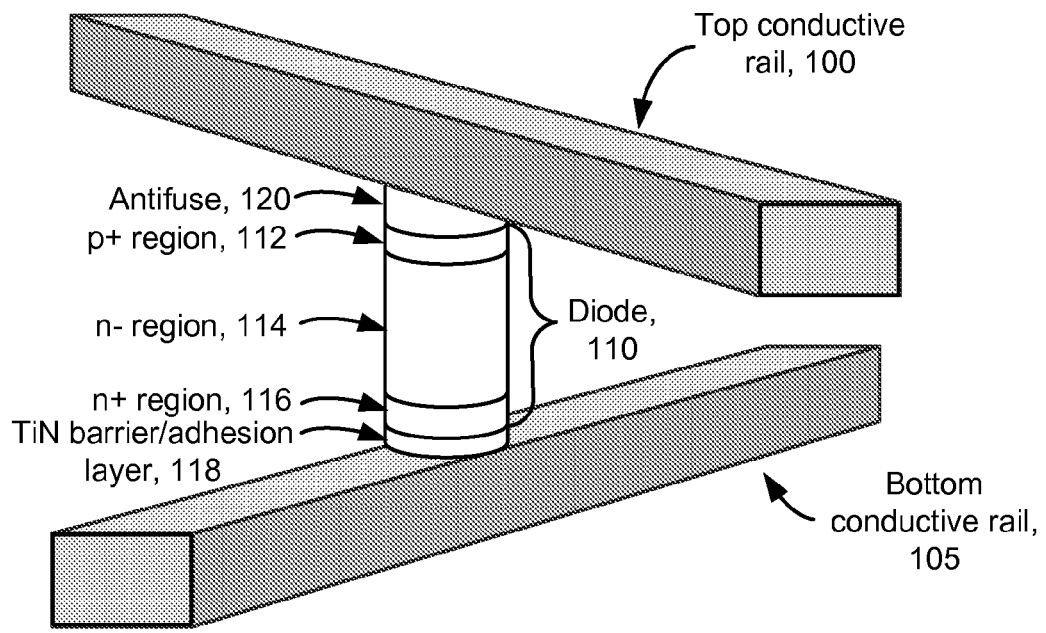
FIG. 1 depicts a memory cell in a 3-D memory device.

FIG. 1 depicts a memory cell in a 3-D memory device. U.S. Pat. No. 6,952,030, mentioned previously, discloses a non-volatile memory cell including a vertically oriented junction diode and a dielectric rupture antifuse interposed between top and bottom conductors. In particular, a vertically oriented junction diode 110 includes a heavily doped semiconductor layer 112 of a first conductivity type (e.g., p+ type), a layer 114 which is undoped or lightly doped semiconductor material, and a heavily doped semiconductor layer 116 of a second conductivity type (e.g., n+ type). The semiconductor material of diode 110 can be, e.g., silicon, germanium, or an alloy of silicon and/or germanium. Diode 110 and dielectric rupture antifuse 120 are arranged in series between a bottom conductor 105 and a top conductor 100, which may be formed of a metal such as tungsten. The conductors can be in the form of rails or other elongated members which extend parallel to one another in a given level and transverse to one another in alternating levels. A titanium nitride adhesion and barrier layer 118 can also be provided between the diode 110 and the bottom conductive rail 105.

The diode 110 can be a junction diode, which is a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

In one possible approach, the heavily doped n-type silicon layer 116 is provided and doped in situ, followed by the layer 114 of intrinsic or lightly doped silicon. Silicon regions 116 and 114 can be amorphous as deposited, and crystallized later to polycrystalline silicon, also referred to as polysilicon. Note that the p+ region 112 can be formed after the silicon is patterned and etched into pillars. For instance, ion implantation of a p-type dopant, for example boron or $BF_2$, can be used to form a shallow junction. For simplicity, formation of a p-i-n diode having an n-region at the bottom and a p-region at the top, formed of silicon, has been described. In alternate embodiments, the polarity of the diode could be reversed, or the semiconductor may be germanium, a silicon-germanium alloy, or some other material.

In the initial state of the memory cell, the diode 110 acts as an open circuit when a read voltage is applied between the top conductor 100 and the bottom conductor 105. The antifuse 120 impedes current flow, and in most embodiments the polycrystalline semiconductor material of diode 110 is formed in a relatively high-resistivity state. Application of a programming voltage between the top conductor 100 and the bottom conductor 105 causes dielectric breakdown of the antifuse material, permanently forming a conductive path through the antifuse 120. The semiconductor material of diode 110 is altered as well, changing it to a lower-resistivity state. After programming, a readily detectable current flows between the top conductor 100 and the bottom conductor 105 upon application of a read voltage. In this way a programmed cell can be distinguished from an unprogrammed cell. Further, the cell is binary. For example, a logical one value can be assigned when no current flows, and a logical zero value can be assigned when current flows.

Various other memory cell configurations are possible. For example, see the discussion below in connection with FIG. 16 and FIGS. 19a-c.

Figure 2A:
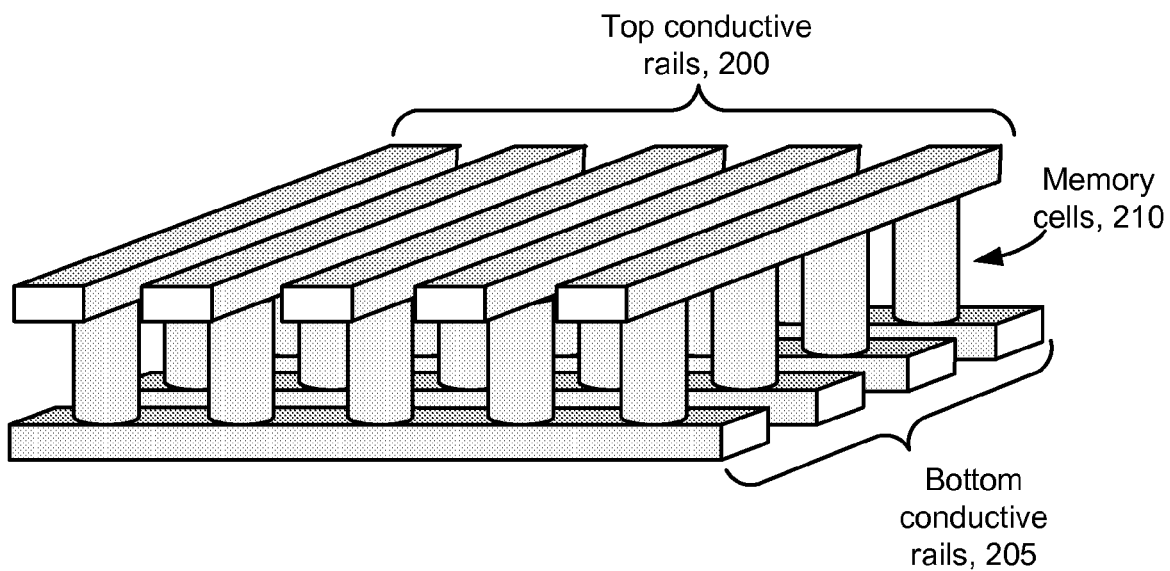
FIG. 2a depicts memory cells and conductive rails in a first level of a 3-D memory device.
Figure 2B:
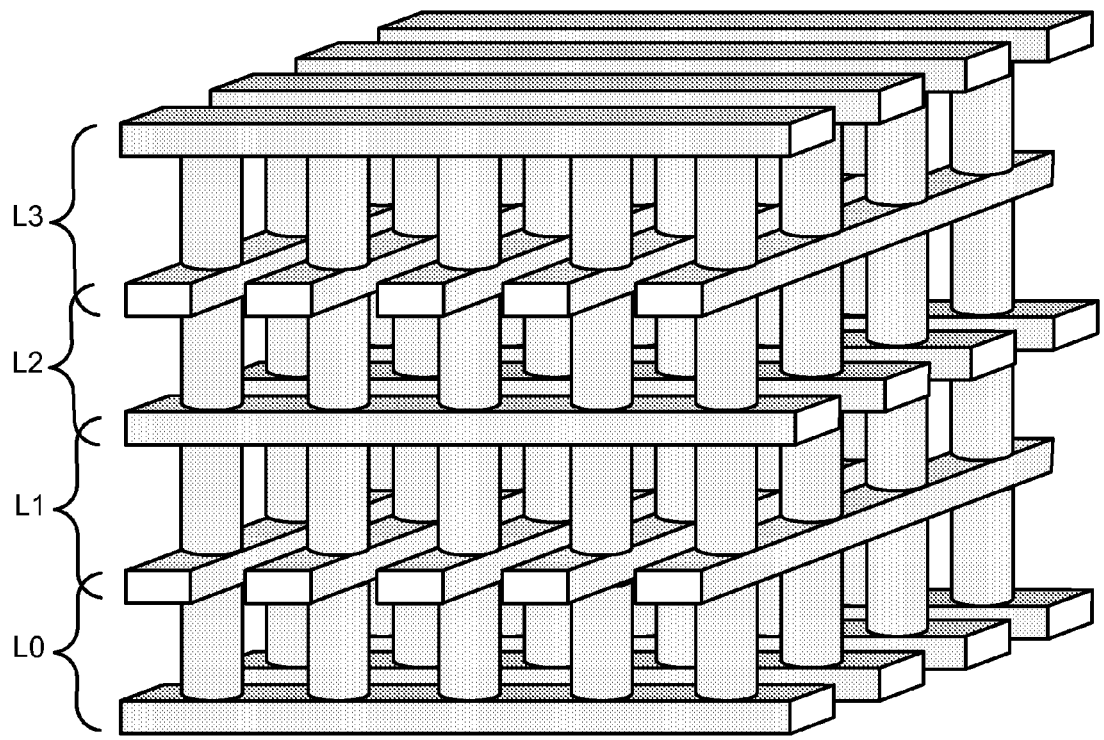
FIG. 2b depicts memory cells and conductive rails in a four level 3-D memory device.

FIG. 2a depicts memory cells and conductive rails in a first level of a 3-D memory device. The structure includes a number of the memory cells 210 such as described in connection with FIG. 1 in a common level, in addition to a number of top conductive rails 200 and bottom conductive rails 205. The top conductive rails 200 extend parallel to one another and the bottom conductive rails 205 extend parallel to one another, but in a transverse direction, in one possible approach. Further, it is possible for the top conductive rails 200 to serve as bottom conductive rails of a next higher level of memory cells. Two, three, four, or more such memory levels may be formed, stacked one atop the other, to form a monolithic three dimensional memory array above a semiconductor substrate such as a monocrystalline silicon wafer. For example, FIG. 2b depicts memory cells and conductive rails in a four level 3-D memory device. The four levels, L0, L1, L2 and L3 indicate how conductive rails are shared by adjacent levels, in one possible implementation. The conductive rails may be shared by adjacent layers, for example, when the doping of the memory cells in alternating layers is reversed, so that the memory cells in alternating layers (e.g., L0 and L2) are n+ on the bottom and p+ on the top, and memory cells in the remaining alternating layers (e.g., L1 and L3) are p+ on the bottom and n+ on the top. This approach can reduce the required number of W/TiN wiring layers. The illustrations are simplified and not all details are shown, such as interconnects between levels.

A monolithic three dimensional memory array or device is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Figure 3:
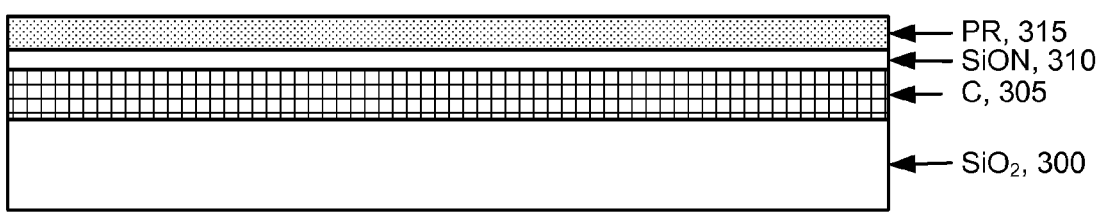
FIG. 3 depicts a layered structure for forming memory cells.

FIG. 3 depicts a layered structure for forming memory cells. As mentioned at the outset, various difficulties have been encountered in etching the polysilicon layer in which the diodes are formed, and the oxide layers in which the conductive rails are formed. For example, resist alone, photoresist in combination with silicon nitride, or silicon dioxide, or tungsten, or titanium nitride have been tried. Combination of those films together have been tried to etch polysilicon and to etch deep into oxide. However, these approaches have not demonstrated sufficient etch resistance to last for the duration of the etch. As a result, these hard mask films can exacerbate line etch roughness, obscure underlying alignment and overlay marks, and be difficult to integrate or remove. An alternative is the use of multilayer resist schemes. However, these tend to be expensive, requiring many steps and difficult processing.

In contrast, silicon-oxynitride ($Si_xO_yN_z$) on amorphous carbon can be used as an effective, easily removable hard mask with high selectivity to silicon, oxide, and tungsten. In this approach, a silicon-oxynitride layer is etched using a photoresist layer, for instance, and the resulting etched silicon-oxynitride layer is used to etch an amorphous carbon layer. Etching the amorphous carbon layer is relatively easy. The etched amorphous carbon layer, in turn, is used to etch one or more layers, including polysilicon and/or oxide. In a variation, the silicon-oxynitride and amorphous carbon layer can be used together as a single hard mask for etching underlying layers. Further, instead of amorphous carbon, other embodiments that could be used include hard mask layers used singly or in combinations of silicon dioxide, silicon nitride, titanium nitride, tungsten, silicon-oxynitride, cobalt silicide, other refractory oxides such as aluminum oxide, nickel oxide, or hafnium oxide. These options also offer a high etch resistance for tall 3-D stacks.

FIGS. 3-27 depicts an overview of an example process for fabricating a 3-d monolithic memory device.

FIG. 3 depicts a layered structure for forming memory cells. Formation of the memory device begins with a substrate, not shown. The substrate can be any semiconducting substrate as known in the art, such as monocrystalline silicon, IV-IV compounds such as silicon-germanium or silicon-germanium-carbon, III-V compounds, II-VII compounds, epitaxial layers over such substrates, or any other semiconducting material. The substrate may include integrated circuits fabricated therein. An insulating layer 300 such as silicon dioxide ($SiO_2$) is formed over the substrate. Alternatively, or additionally, the insulating layer 300 can include a high-dielectric film, Si—C—O—H film, or any other suitable insulating material. An amorphous carbon ($\alpha$-C or C) layer 305 is deposited on the silicon dioxide layer 300, a silicon oxynitride ($Si_xO_yN_z$) layer (depicted by the notation "SiON") is deposited on the amorphous carbon layer 305 and a photoresist (PR) layer 315 is provided on the silicon-oxynitride layer 310.

In one possible implementation, the photoresist layer is of a type which is exposed by 193 nm (deep ultraviolet) light and is about 900 to 2000 Angstroms thick in a direction perpendicular to the plane of the substrate. The silicon-oxynitride layer 310 has a starting thickness of about 220 to 420 Angstroms, and can be a dielectric antireflective coating (DARC). Optionally, a bottom anti reflective coating (BARC) can be used on top of the DARC, but does not replace the properties of the DARC in masking the amorphous carbon film stack. The amorphous carbon layer 305 has a starting thickness of approximately 2700 to 3300 Angstroms. The thickness of the amorphous carbon layer 305 is defined by the film stack below it that is being etched and should take into account the fact that the layer 305 does get eroded during the etch process. The amorphous carbon can be obtained as Advanced Patterning Film (APF) from Applied Materials Inc., Santa Clara, Calif. The silicon dioxide layer 300 has a starting thickness of approximately 6000 Angstroms. The thicknesses vary depending on the requirements of the process architecture.

Figure 4:
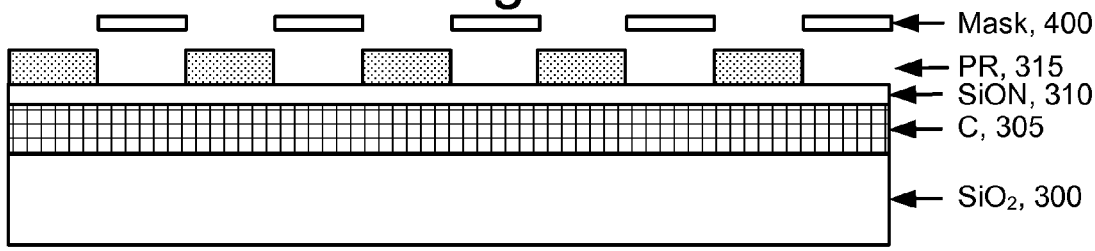
FIG. 4 depicts patterning of a photoresist layer of the layered structure of FIG. 3 using a photomask.
Figure 5:
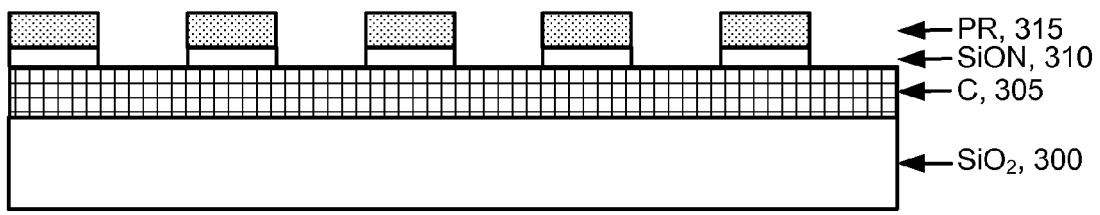
FIG. 5 depicts patterning of a silicon-oxynitride layer using a mask formed by the photoresist layer of the layered structure of FIG. 4.
Figure 6:
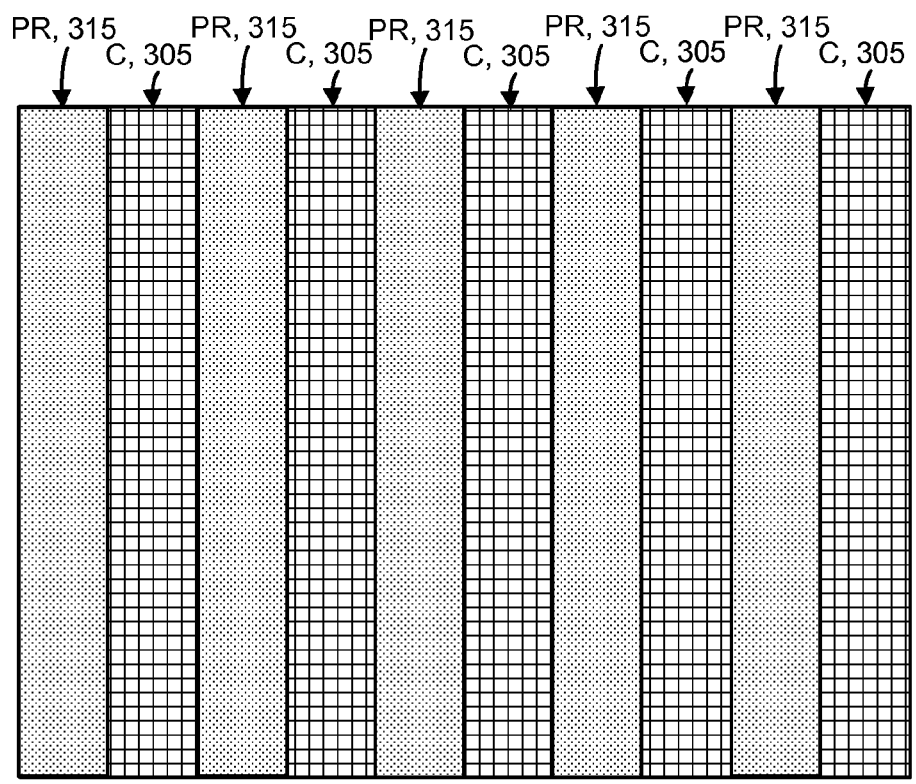
FIG. 6 depicts a top view of the layered structure of FIG. 5.

FIG. 4 depicts patterning of a photoresist layer 315 of the layered structure of FIG. 3 using a photomask. In one possible approach, a pattern of a photomask 400 is transferred to the photoresist layer 315 by selectively exposing the photoresist layer to UV light and removing the exposed portion of the photoresist using a developer. The photomask 400 can be an attenuated phase shift mask. FIG. 5 depicts patterning of a silicon-oxynitride layer using a mask formed by the photoresist layer of the layered structure of FIG. 4. Here, the silicon-oxynitride layer 310 is etched using the photoresist layer 315 as a mask to transfer the pattern to the silicon-oxynitride layer. The pattern which is transferred may include parallel, longitudinal openings as depicted by FIG. 6. FIG. 6 depicts a top view of the layered structure of FIG. 5.

Figure 7:
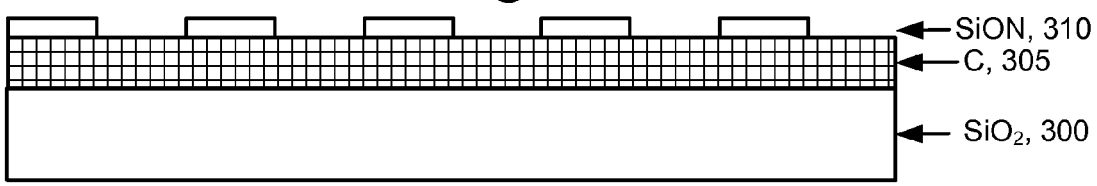
FIG. 7 depicts a patterned silicon-oxynitride layer which remains after removal of a photoresist material.
Figure 8:
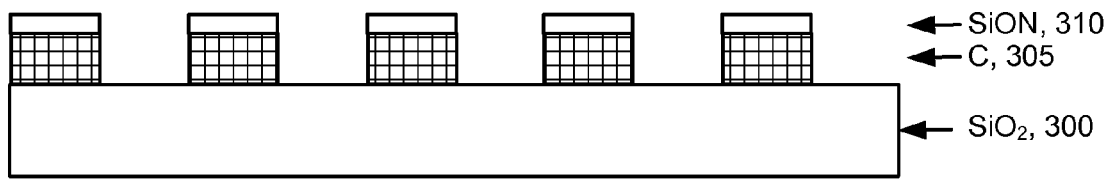
FIG. 8 depicts patterning of an amorphous carbon layer using the silicon-oxynitride layer of FIG. 7 as a hard mask.
Figure 9:
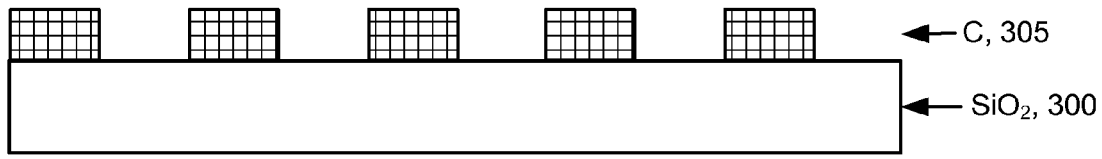
FIG. 9 depicts a patterned amorphous carbon layer which remains after removal of silicon-oxynitride material.
Figure 10:
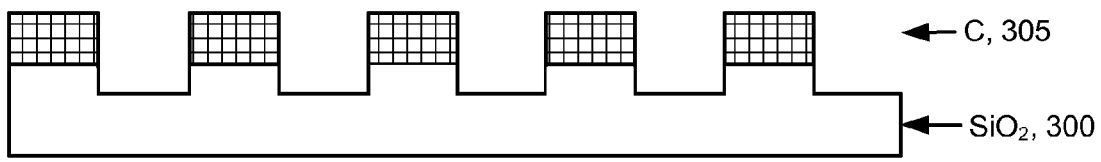
FIG. 10 depicts patterning of parallel trenches in a silicon dioxide layer using the amorphous carbon layer of FIG. 9 as a hard mask.

FIG. 7 depicts a patterned silicon-oxynitride layer which remains after removal of a photoresist material. After the photoresist layer is removed, the patterned silicon-oxynitride layer can be used as a hard mask to etch one or more underlying layers. In one approach, the silicon-oxynitride layer 310 is used to etch the underlying amorphous carbon layer (C) 305. FIG. 8 depicts patterning of an amorphous carbon layer using the silicon-oxynitride layer of FIG. 7 as a hard mask. In practice, portions of the silicon-oxynitride layer 310 will also be worn away during the etch. The remaining portions of the silicon-oxynitride layer 310 are removed, leaving the patterned C layer 305. FIG. 9 depicts a patterned amorphous carbon layer which remains after removal of silicon-oxynitride material. FIG. 10 depicts patterning of parallel trenches in a silicon dioxide layer using the amorphous carbon layer of FIG. 9 as a hard mask. The etching of the parallel trenches is made more accurate due to the formation of the amorphous carbon hard mask by the silicon-oxynitride hard mask. Note that some or all of the amorphous carbon layer will wear away during the etching. The patterning of the silicon dioxide layer 300 using the patterned amorphous carbon layer 305 may include patterning one or more intermediate layers using the patterned amorphous carbon layer 305, and patterning the silicon dioxide layer using the one or more intermediate layers. In an alternative approach, a common pattern is transferred to both the silicon-oxynitride layer and the amorphous carbon layer 305 to form a structure as depicted in FIG. 8 and the two layers together are used as a hard mask for patterning the silicon dioxide layer 300. A pattern could, for instance, be transferred to a BARC layer on top of the DARC layer, and then to the DARC layer and the amorphous carbon/advanced patterning film (APF). Alternatively, the DARC/APF stack may transfer their pattern to other films below.

Figure 11:
FIG. 11 depicts the patterned silicon dioxide layer of FIG. 10 after removal of the amorphous carbon layer.
Figure 12:
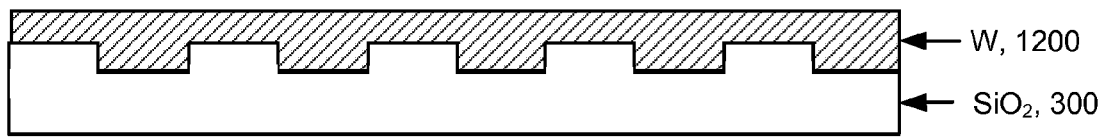
FIG. 12 depicts a conductive material filled into the parallel trenches in the patterned silicon dioxide layer of FIG. 11.

FIG. 11 depicts the patterned silicon dioxide layer of FIG. 10 after removal of the amorphous carbon layer. In a Damascene process, features are formed by forming voids in a dielectric, then filling those voids with conductive or semiconductor material. For example, the amorphous carbon layer 305 can be used as a hard mask for etching the silicon dioxide layer 300 to form a number of spaced apart parallel trenches. A conductive material such as tungsten (W) is then deposited to fill the trenches. FIG. 12 depicts a conductive material such as tungsten 1200 filled into, and overfilling, the parallel trenches in the etched silicon dioxide layer of FIG. 11. The tungsten overfill can then be removed, for example by chemical-mechanical planarization (CMP), forming rails with planarized surfaces. The tungsten could be replaced by a refractory metal such as aluminum titanium nitride (AlTiN). A refractory metal is suitable to withstand high temperatures that are experienced when silicon is deposited as the device is built up in three dimensions. The tungsten could also be replaced by a tungsten alloy, copper and/or aluminum.

Figure 13:
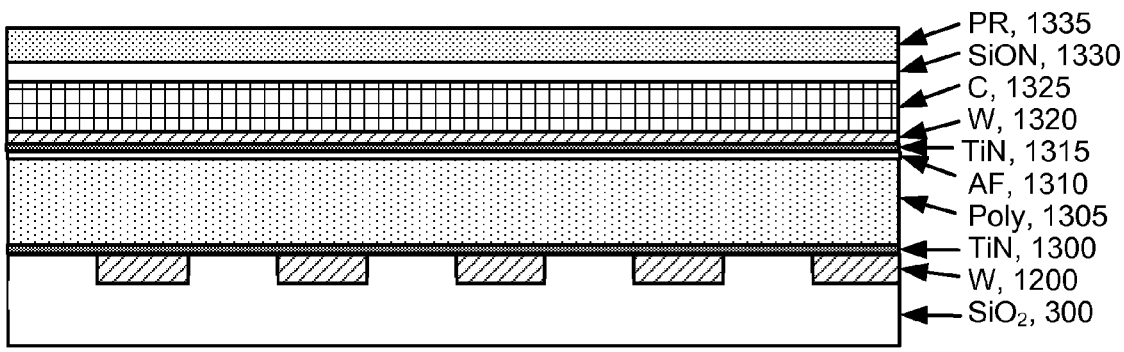
FIG. 13 depicts a layered structure formed from the layered structure of FIG. 12 by removing the excess conductive material and providing a titanium nitride (TiN) layer, a polysilicon layer, a titanium nitride layer, a tungsten layer, an amorphous carbon layer, a silicon-oxynitride layer and a photoresist layer.

FIG. 13 depicts a layered structure formed from the layered structure of FIG. 12 by removing the excess conductive material and providing a titanium nitride layer, a polysilicon layer, a titanium nitride layer, a tungsten layer, an amorphous carbon layer, a silicon-oxynitride layer and a photoresist layer. The spaced apart rails of the conductive material 1200 such as tungsten are depicted from a cross sectional view. Subsequently, a titanium nitride layer 1300 is deposited as a barrier/adhesion layer. A polysilicon layer 1305 is then provided. As mentioned in connection with FIG. 1, amorphous silicon regions can be deposited and crystallized later to form polycrystalline silicon, also referred to as polysilicon. A heavily doped n-type silicon layer can be provided and doped in situ, followed by a layer of intrinsic or lightly doped silicon. A heavily doped p-type region can be formed after the silicon is patterned and etched into pillars, as discussed in connection with FIG. 1.

A dielectric rupture antifuse (AF) layer 1310 is formed at a top region of the polysilicon layer 1305, for example, by rapid thermal oxidation of the underlying silicon to form silicon dioxide, about 18 Angstroms thick, for instance. Or, the antifuse layer could be provided as a high k material such as hafnium oxide, aluminum oxide or some other dielectric.

Short layers of titanium nitride 1315 and tungsten 1320 are provided at the top of the polysilicon layer 1305 as a metal-to-metal contact to the overlying conductive rail which is subsequently formed. An amorphous carbon layer 1325, silicon-oxynitride layer 1330 and photoresist layer 1335 are then provided. Similar to the steps depicted in FIGS. 3-9, a pattern is transferred to the photoresist layer 1335, then to the silicon-oxynitride layer 1330 and then to the amorphous carbon layer 1325 to provide the layered structure of FIG. 14a. The photoresist layer 1335 can be patterned using a chromeless mask.

In one possible implementation, the photoresist layer 1335 includes 193 nm resist and is about 900 to 2000 Angstroms thick. The silicon-oxynitride layer 1330 has a starting thickness of about 220 to 420 Angstroms, and can be a dielectric antireflective coating. The thickness of the silicon-oxynitride layer 1330 is set based on the photoresist layer 1335. The amorphous carbon layer 1325 has a starting thickness of approximately 2700 to 3300 Angstroms. The amorphous carbon can be obtained as advanced patterning film (APF) from Applied Materials Inc., Santa Clara, Calif. The tungsten layer 1320 has a starting thickness of approximately 500 Angstroms, up to about 1000 Angstroms. In one implementation, it is desirable to have about 300 Angstroms of the tungsten layer 1320 remaining when processing is complete. If the etch process is very good, the starting thickness of the tungsten layer 1320 can be not much higher than 300 Angstroms.

The titanium nitride layer 1315 has a thickness of about 200 Angstroms as a minimum. The polysilicon layer has a starting thickness of about, 2200 to 3400 Angstroms. The titanium nitride layer 1300 has a thickness of about 100 Angstroms as a minimum. The thicknesses vary depending on the requirements of the process architecture.

Figure 14A:
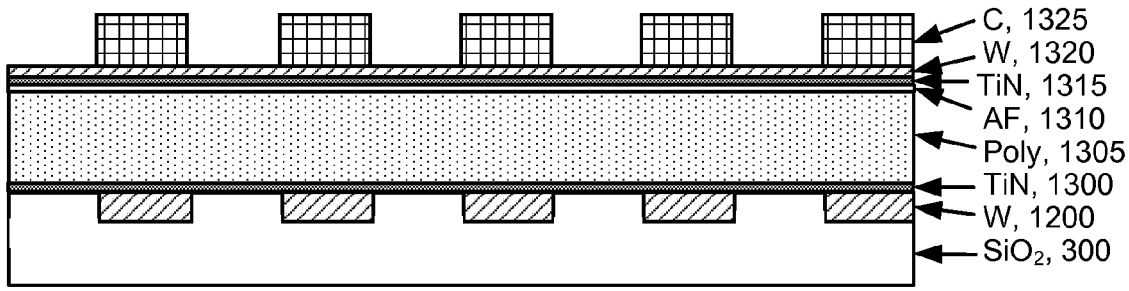
FIG. 14a depicts a layered structure formed from the layered structure of FIG. 13 by patterning the silicon-oxynitride layer using the photoresist layer and patterning the amorphous carbon layer using the patterned silicon-oxynitride layer as a hard mask.
Figure 14B:
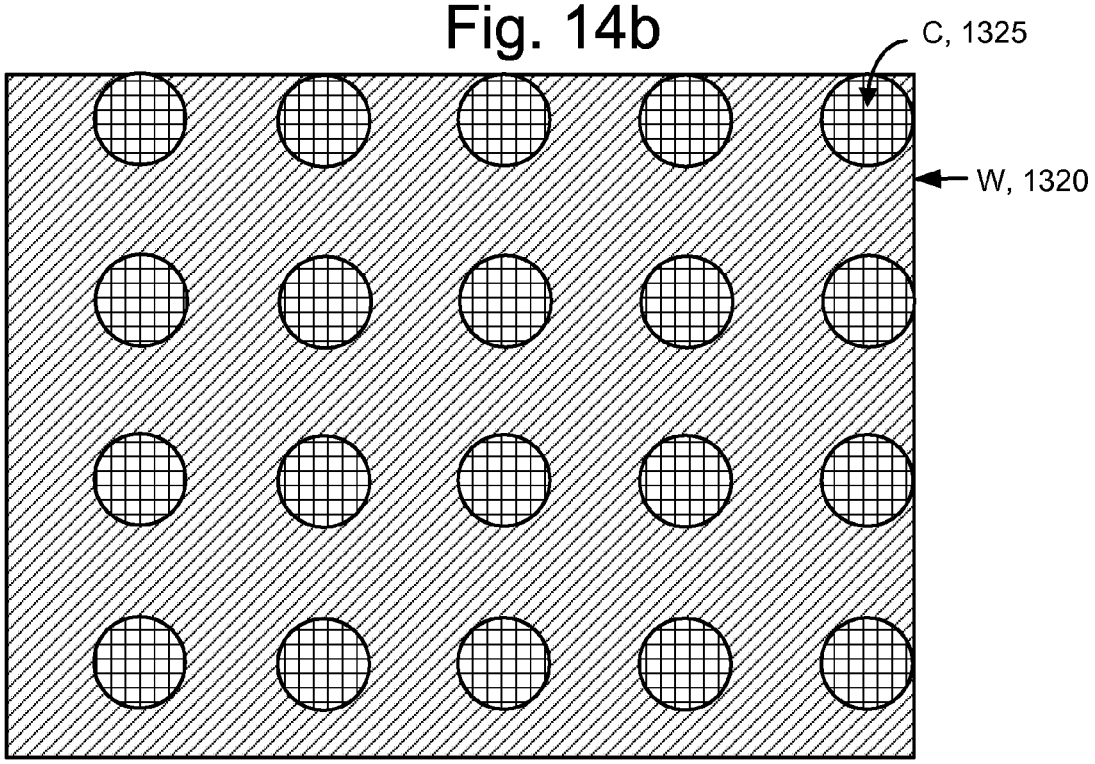

FIG. 14a depicts a layered structure formed from the layered structure of FIG. 13 by patterning the silicon-oxynitride layer using the photoresist layer and patterning the amorphous carbon layer using the patterned silicon-oxynitride layer as a hard mask. FIG. 14b depicts a top view of the layered structure of FIG. 14a. The pattern can be uniform in two dimensions across a surface of the layered structure. In one approach, a series of cylindrical, e.g., pillar or post shaped, memory cells are formed. However, other cross-section shapes may be used. The pillars at the edge of the device can be dummies which undergo optical proximity correction. In one implementation, the pattern density is 50%, meaning there is a regular, uniform pattern.

Figure 15:
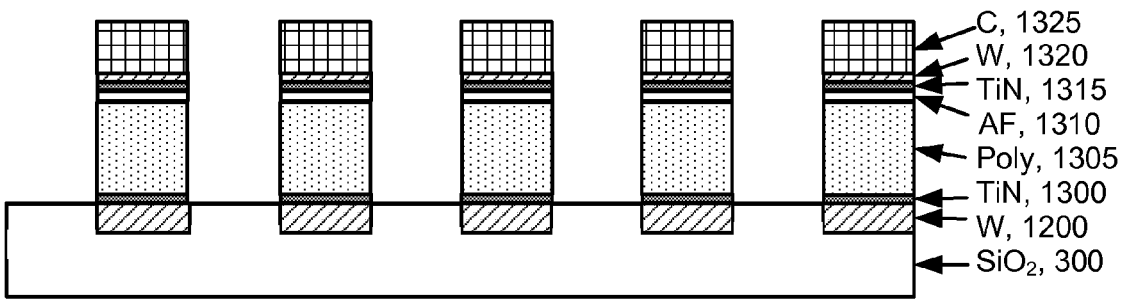
FIG. 15 depicts a layered structure formed from the layered structure of FIG. 14a by patterning the tungsten, titanium nitride, polysilicon and titanium nitride layers using the patterned amorphous carbon layer as a hard mask.
Figure 16:
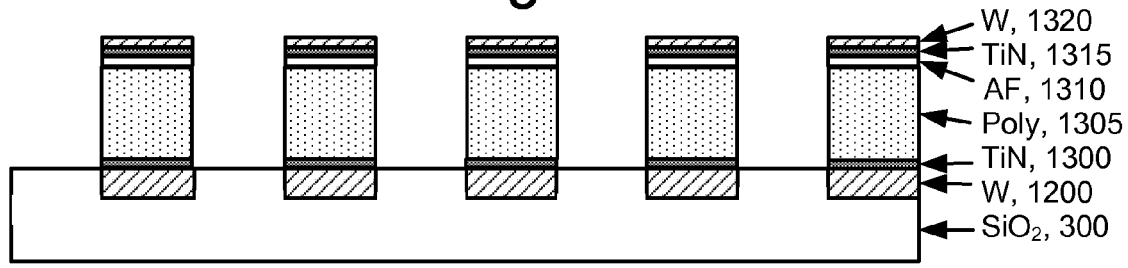
FIG. 16 depicts a layered structure formed from the layered structure of FIG. 15 by removing the patterned amorphous carbon layer.

FIG. 15 depicts a layered structure formed from the layered structure of FIG. 14a by patterning the tungsten layer 1320, titanium nitride layer 1315, polysilicon layer 1305 and titanium nitride layer 1300 in a single photolithographic step using the patterned amorphous carbon layer 1325 as a hard mask. Note that some or all of the amorphous carbon layer 1325 will wear away during the etching. The patterning of the polysilicon layer 1305 using the patterned amorphous carbon layer 1325 can include patterning one or more intermediate layers (e.g., tungsten layer 1320 and titanium nitride layer 1315) using the patterned amorphous carbon layer and patterning the polysilicon layer using the one or more intermediate layers. In an alternative approach, a common pattern is transferred to both the silicon-oxynitride layer and the amorphous carbon layer 305 and the two layers together are used as a hard mask for etching the polysilicon layer 1305 and the titanium nitride layer 1300. FIG. 16 depicts a layered structure formed from the layered structure of FIG. 15 by removing the patterned amorphous carbon layer.

Figure 17:
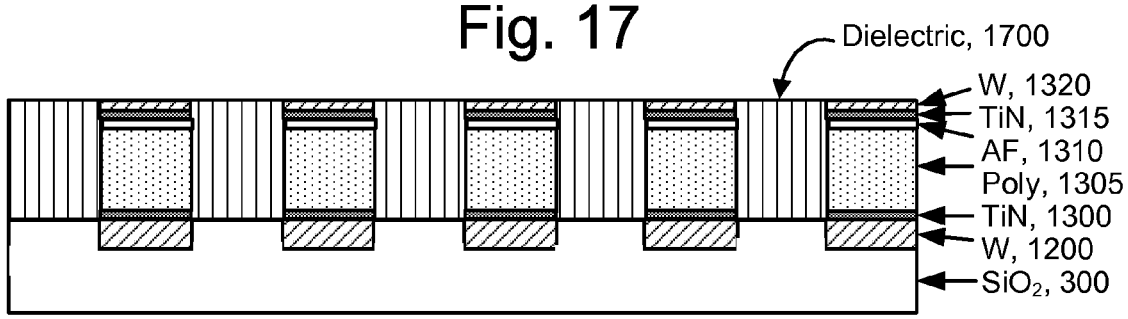
FIG. 17 depicts a layered structure formed from the layered structure of FIG. 16 by filling in voids with a dielectric.

FIG. 17 depicts a layered structure formed from the layered structure of FIG. 16 by filling in voids with a dielectric 1700. The dielectric material 1700 can be a uniform dielectric such as Tetraethyl Orthosilicate (TEOS).

Figure 18:
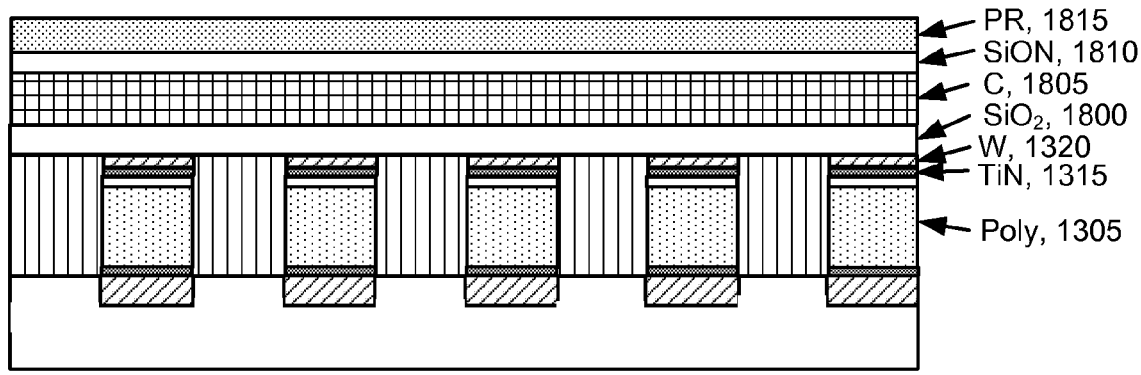
FIG. 18 depicts a layered structure formed from the layered structure of FIG. 17 by depositing a silicon dioxide layer, amorphous carbon layer, a silicon-oxynitride layer and a photoresist layer.

At this point, the lower conductive rails and the memory cells have been formed. Next, an upper conductive rail and a next level of memory cells is formed. As mentioned, the upper conductive rails can run transversely to the lower conductive rails. FIG. 18 depicts a layered structure formed from the layered structure of FIG. 17 by depositing a silicon dioxide layer 1800, an amorphous carbon layer 1805, a silicon-oxynitride layer 1810 and a photoresist layer 1815.

Figure 19A:
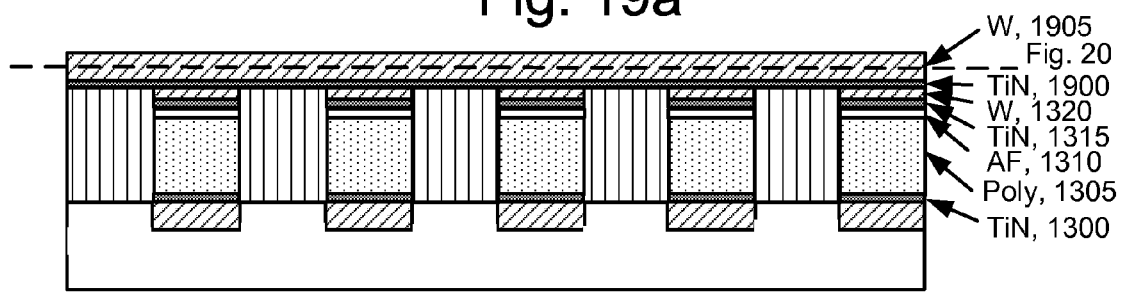
FIG. 19a depicts a layered structure formed from the layered structure of FIG. 18 by patterning the photoresist, patterning the silicon-oxynitride layer using the patterned photoresist, patterning the amorphous carbon using the patterned silicon-oxynitride layer, patterning the silicon dioxide layer using the patterned amorphous carbon to form parallel trenches and depositing a conductive material into the parallel trenches.

FIG. 19a depicts a layered structure formed from the layered structure of FIG. 18 by patterning the photoresist 1815, etching the silicon-oxynitride layer 1810 using the patterned photoresist, and etching the amorphous carbon layer 1805 using the patterned silicon-oxynitride layer as a hard mask. The silicon dioxide layer 1800 is patterned using the patterned amorphous carbon as a hard mask to form parallel trenches, e.g., in a Damascene process. Subsequently, titanium nitride 1900 and a conductive material such as tungsten 1905 are deposited into the parallel trenches, and the excess tungsten is removed. The tungsten layer 1320 serves as a cap on the memory cell which protects the antifuse layer 1310 from being etched away in case of an overshoot when the trenches are etched.

Figure 19B:
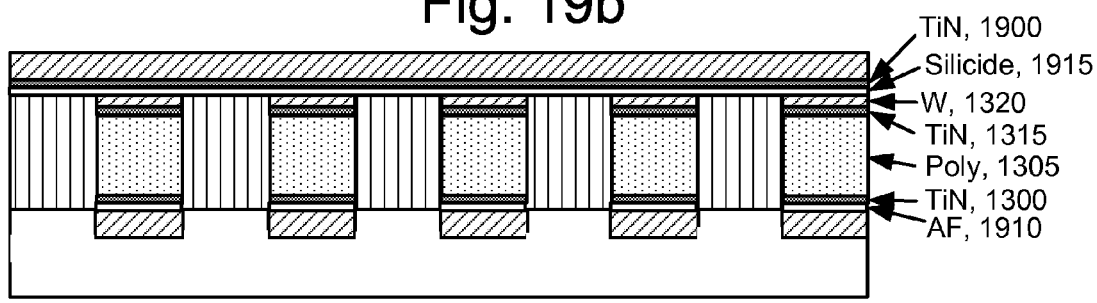
FIGS. 19b and 19c depict alternative layered structures.
Figure 19C:
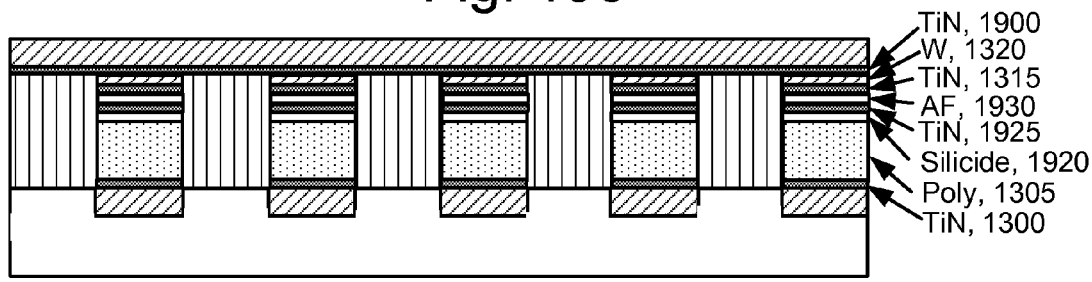

FIGS. 19b and 19c depict alternative layered structures. As mentioned, various configurations for the memory cells can be provided. In one approach, the antifuse is provided at the bottom of the memory cell as a high k layer. For example, see antifuse layer 1910 in FIG. 19b. Moreover, a silicide layer 1915, such as cobalt silicide or titanium silicide, is part of the conductive rail. In another option, a metal-insulator-metal (MIM) design is used in which the antifuse layer is between metal layers. For example, in FIG. 19b, see antifuse layer 1930, and metal (e.g., TiN) layers 1925 and 1315. A silicide layer 1920 is also provided. In these alternative cases, by analogy to FIG. 15, etching of the stack can occur using the amorphous carbon hard mask. For the case of FIG. 19b, the amorphous carbon hard mask is used to etch through, in a single photolithographic step, the tungsten layer 1320, titanium nitride layer 1315, polysilicon layer 1305, titanium nitride layer 1300 and antifuse layer 1910. For the case of FIG. 19c, the amorphous carbon hard mask is used to etch through, in a single photolithographic step, the tungsten layer 1320, titanium nitride layer 1315, antifuse layer 1930, titanium nitride layer 1925, silicide layer 1920, polysilicon layer 1305 and titanium nitride layer 1300.

The high k layer can have a dielectric constant k greater than about eight, for instance. Note that high k dielectric materials have been investigated for use in gate oxides of transistors because they can be made thicker than a gate oxide of, say, silicon dioxide while having the same or better capacitance. These gate oxides serve a different role in the transistor, however, than the antifuse described here. These gate oxides are not intended, at any point in the life of the device, to suffer dielectric breakdown. Atomic layer deposition (ALD) can be used to form the dielectric rupture antifuse of a high k material. Recent advances in ALD techniques have allowed an extremely high-quality layer of high-k material to be formed which is very thin, for example 50, 30, 20, or 10 angstroms, or less. This very thin layer is of such high quality that leakage current is acceptably low, and such a thin layer requires lower voltage to break down. Moreover, many high k dielectrics can be formed at relatively low temperature by various deposition processes, including ALD. As a general rule, reducing processing temperature is always advantageous in fabrication of a complex semiconductor device, minimizing dopant diffusion, peeling, and other problems.

The value of dielectric constant k for this material can be between, e.g., 8 and 50, most commonly between about 8 and about 25. This layer can be between about 10 and about 200 Angstroms, for example, commonly between about 20 and about 100 Angstroms. The dielectric materials can include $HfO_2$, $Al_2O_3$, $ZrO_2$, $TiO_2$, $La_2O_3$, $Ta_2O_5$, $RuO_2$, $ZrSiO_x$, $AlSiO_x$, $HfSiO_x$, $HfAlO_x$, $HfSiON$, $ZrSiAlO_x$, $HfSiAlO_x$, $HfSiAlON$, and $ZrSiAlON$. In some embodiments two or more of these materials may be blended. Hafnium oxide, $HfO_2$, which has a dielectric constant of about 25, or aluminum oxide, $Al_2O_3$, which has a dielectric constant of about 9, are especially suitable. In general, materials of comparable film quality having a higher dielectric constant should be thicker than those with a lower dielectric constant.

Figure 20:
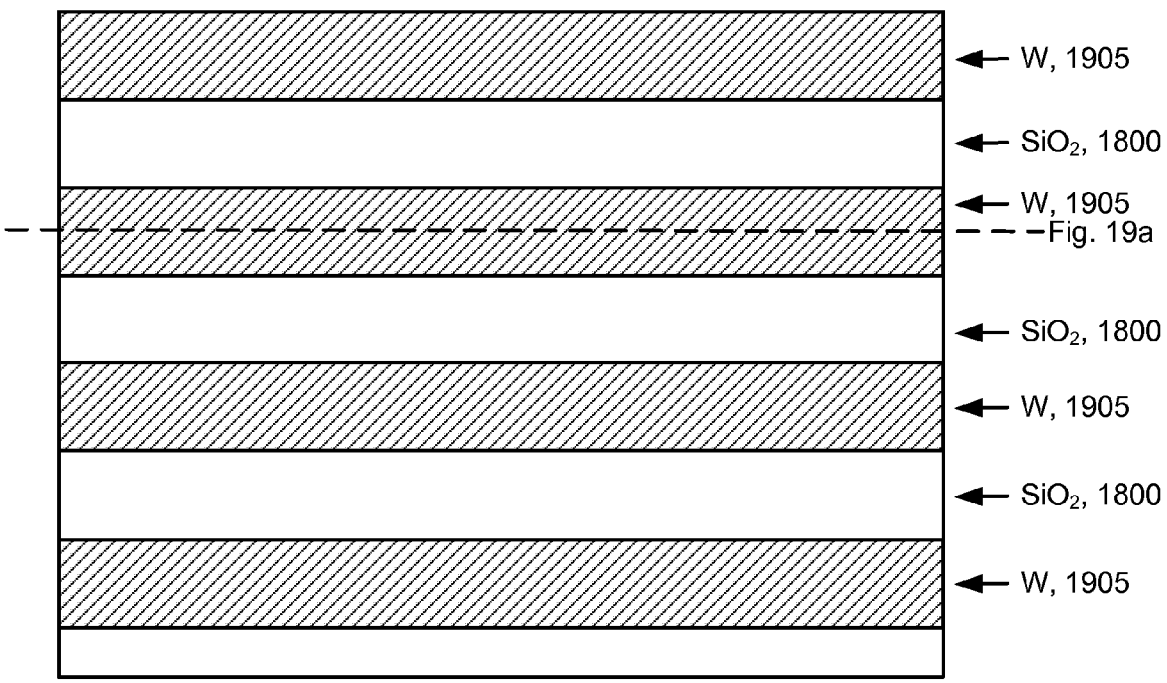

FIG. 20 depicts a top view of the layered structure of FIG. 19a. Note that the conductive rail 1905 runs transversely to the conductive rails 1200.

Figure 21:
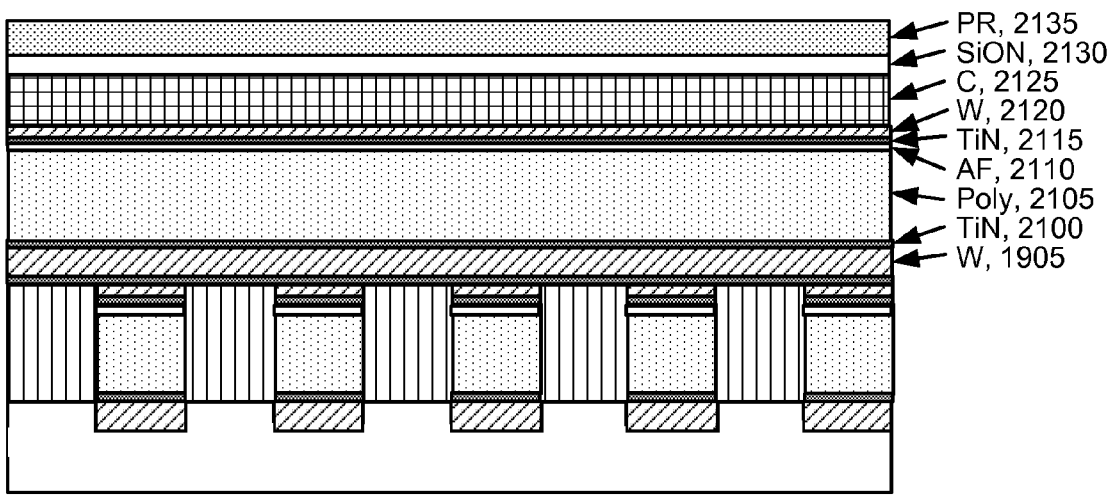
FIG. 21 depicts a layered structure formed from the layered structure of FIG. 20 by removing the excess conductive material and depositing a titanium nitride layer, a polysilicon layer, a titanium nitride layer, a tungsten layer, an amorphous carbon layer, a silicon-oxynitride layer and a photoresist layer.

Next, the second level of memory cells is formed. FIG. 21 depicts a layered structure formed from the layered structure of FIG. 20 by removing the excess conductive material and providing a titanium nitride layer 2100, a polysilicon layer 2105, a titanium nitride layer 2115, a tungsten layer 2120, an amorphous carbon layer 2125, a silicon-oxynitride layer 2130 and a photoresist layer 2135.

Figure 22:
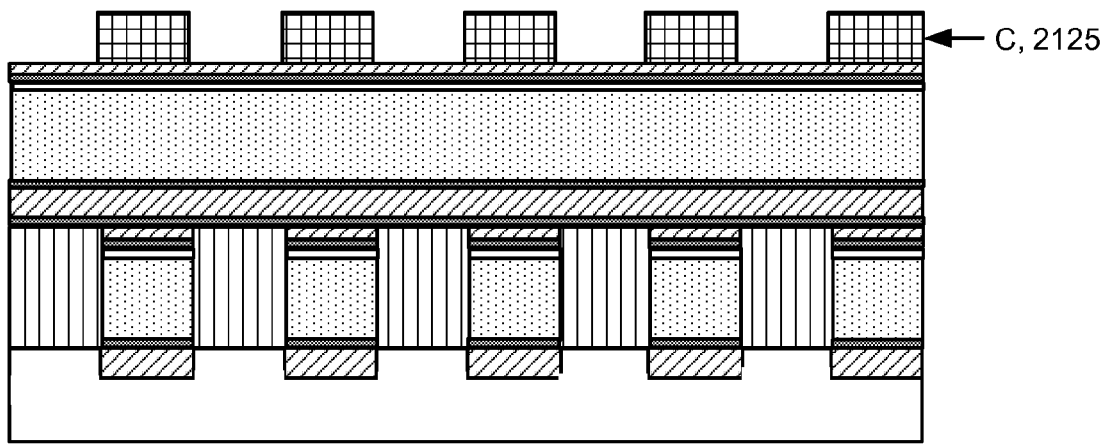
FIG. 22 depicts a layered structure formed from the layered structure of FIG. 21 by patterning the silicon-oxynitride layer using the photoresist layer and patterning the amorphous carbon layer using the patterned silicon-oxynitride layer as a hard mask.

FIG. 22 depicts a layered structure formed from the layered structure of FIG. 21 by etching the silicon-oxynitride layer 1230 using the photoresist layer 2135 and etching the amorphous carbon layer 2125 using the patterned silicon-oxynitride layer 1230 as a hard mask.

Figure 23:
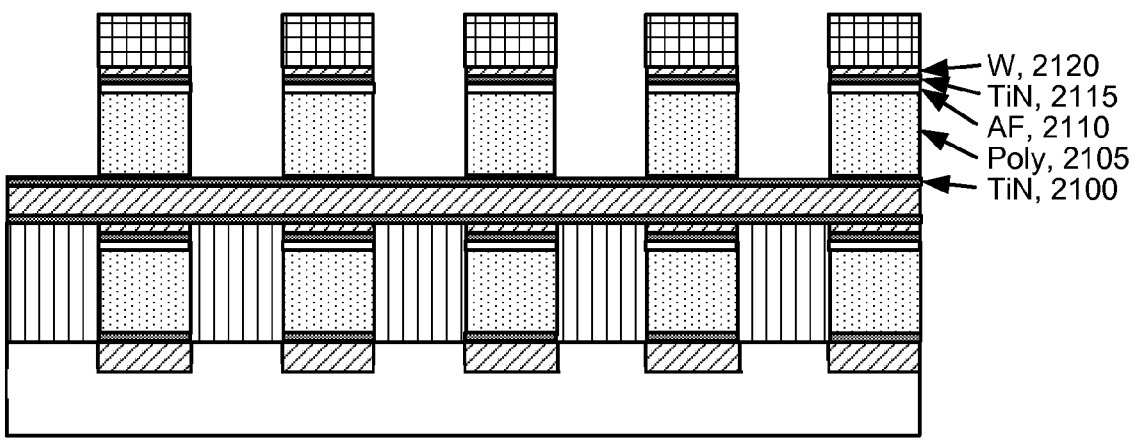
FIG. 23 depicts a layered structure formed from the layered structure of FIG. 22 by patterning the tungsten, titanium nitride and polysilicon layers using the patterned amorphous carbon layer as a hard mask.
Figure 24:
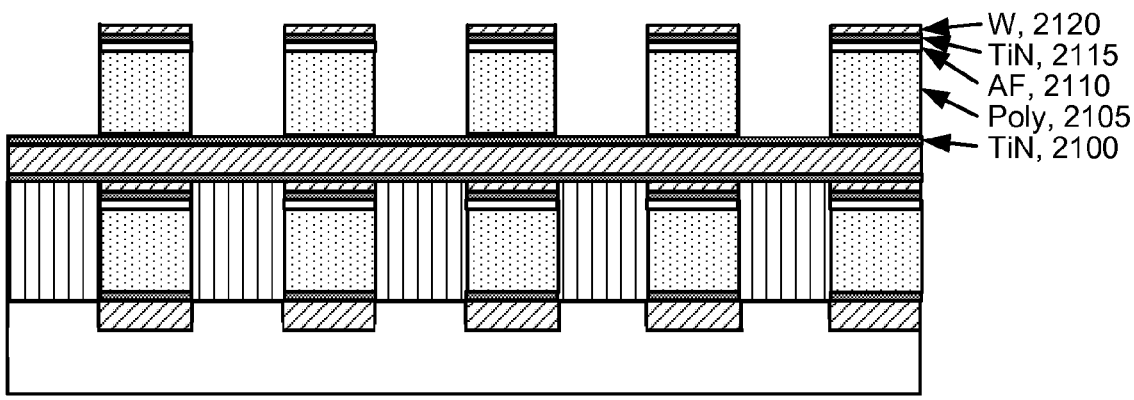
FIG. 24 depicts a layered structure formed from the layered structure of FIG. 23 by removing the patterned amorphous carbon layer.
Figure 25:
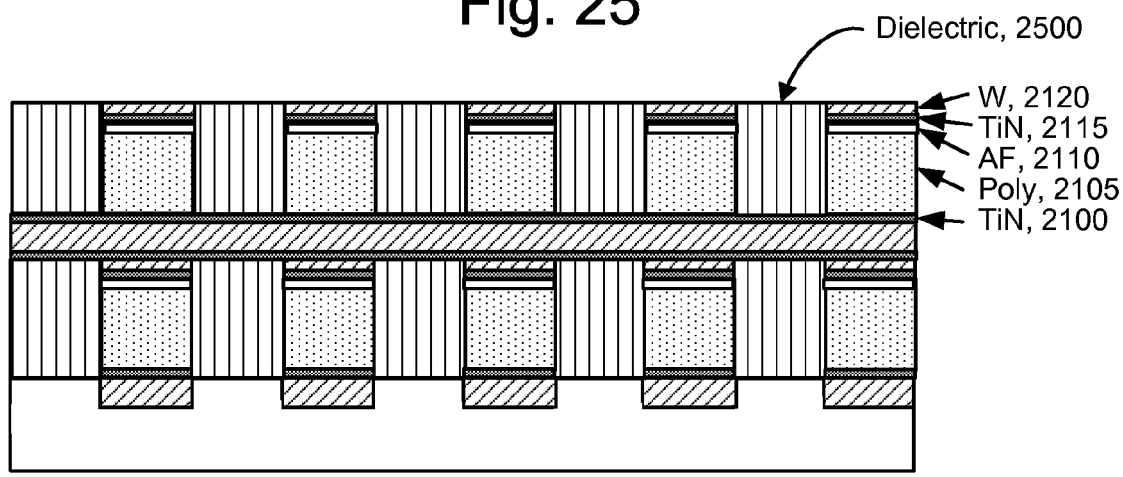
FIG. 25 depicts a layered structure formed from the layered structure of FIG. 24 by filling in voids with a dielectric.

FIG. 23 depicts a layered structure formed from the layered structure of FIG. 22 by patterning the tungsten layer 2120, titanium nitride layer 2115 and polysilicon layer 2105 in a single photolithographic step using the patterned amorphous carbon layer as a hard mask. FIG. 24 depicts a layered structure formed from the layered structure of FIG. 23 by removing the patterned amorphous carbon layer 2125. FIG. 25 depicts a layered structure formed from the layered structure of FIG. 24 by filling in voids with a dielectric 2500. At this point, the second level of memory cells has been formed, but an upper conductive rail for this level has not yet been formed. Using the techniques described herein, additional levels of memory cells can be formed.

Figure 26:
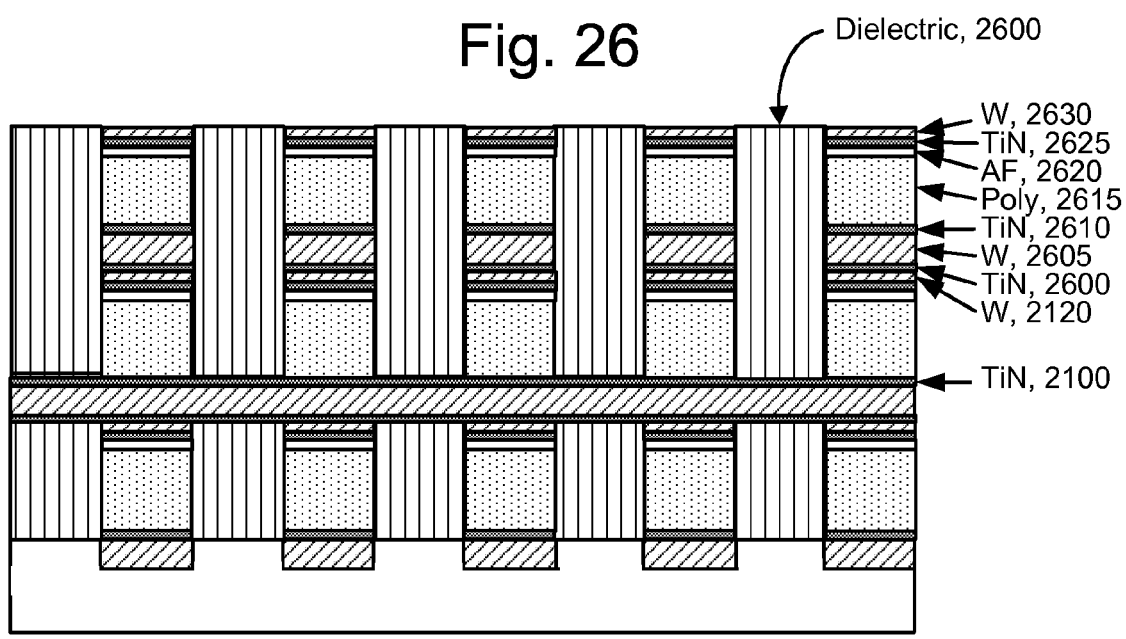
FIG. 26 depicts an additional layer of memory cells formed on the layered structure of FIG. 25.

For example, FIG. 26 depicts an additional, third layer of memory cells formed on the layered structure of FIG. 25. The additional layer includes a titanium nitride layer 2600, a tungsten layer 2605, a titanium nitride layer 2610, a polysilicon layer 2615 including an antifuse layer 2620, a titanium nitride layer 2625 and a tungsten layer 2630. The third layer of memory cells is formed in the polysilicon layer 2615, while a lower conductive rail for the third layer is formed in the tungsten layer 2605.

Figure 27:
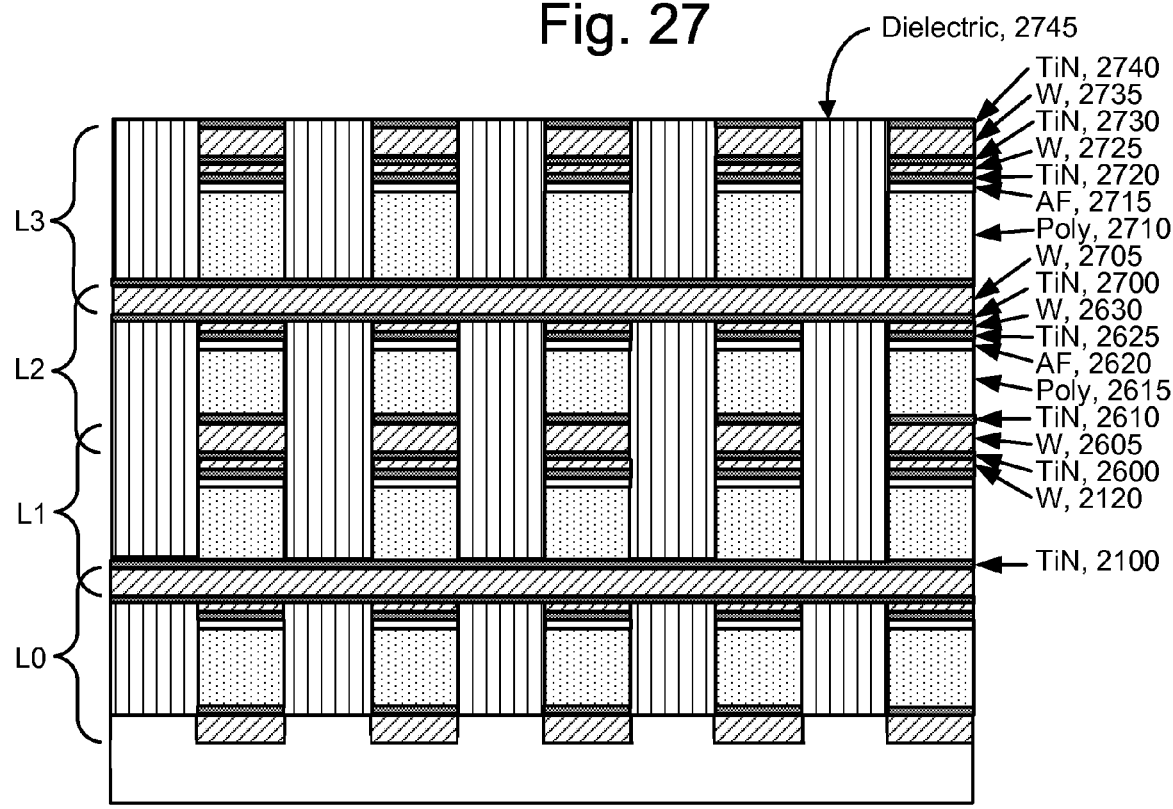
FIG. 27 depicts an additional layer of memory cells formed on the layered structure of FIG. 26.

FIG. 27 depicts an additional, fourth layer of memory cells formed on the layered structure of FIG. 26. The structure includes a titanium nitride layer 2700, a tungsten layer 2705, a polysilicon layer 2710 including an antifuse layer 2715, a titanium nitride layer 2720, a tungsten layer 2725, a titanium nitride layer 2730, a tungsten layer 2735 and a titanium nitride layer 2740. The fourth layer of memory cells is formed in the polysilicon layer 2615. A lower conductive rail for the fourth layer is formed in the tungsten layer 2705, while an upper conductive rail for the fourth layer is formed in the tungsten layer 2735. In this example, the overall memory device includes four layers, L0, L1, L2 and L3. Additional silicon-oxynitride layers can be provided as well. Each layer includes a set of memory cells with upper and lower conductive members such as rails. The lower conductive rails are part of a bottom wiring layer which is coupled to bottom portions of the memory cells, while the upper conductive rails are part of an upper wiring layer which is coupled to top portions of the memory cells. Further, the conductive rails may be shared by adjacent layers. Additional details such as interconnects between levels are not shown.

A zia, which is a deep via interconnect between metallizations that goes all the way through the layered device, can also be formed using the techniques provided herein. In an example implementation, an attenuated phase shift photo mask can be used to pattern a photoresist layer, which includes 193 nm resist and is about 900 to 2000 Angstroms thick. The photoresist layer is used to pattern a silicon-oxynitride layer, which has a starting thickness of about 220 to 420 Angstroms. The silicon-oxynitride layer is used to pattern an amorphous carbon layer, which has a starting thickness of approximately 7200 to 8800 Angstroms. The amorphous carbon layer is used to pattern a silicon dioxide layer, which has a starting thickness of approximately 18,000 to 22,000 Angstroms. As before, the thicknesses vary depending on the requirements of the process architecture. Moreover, note that other materials besides oxide may be removed in the zia etch. For instance, polysilicon may be removed in the zia etch in order to connect various levels of metallization.

Figure 28:
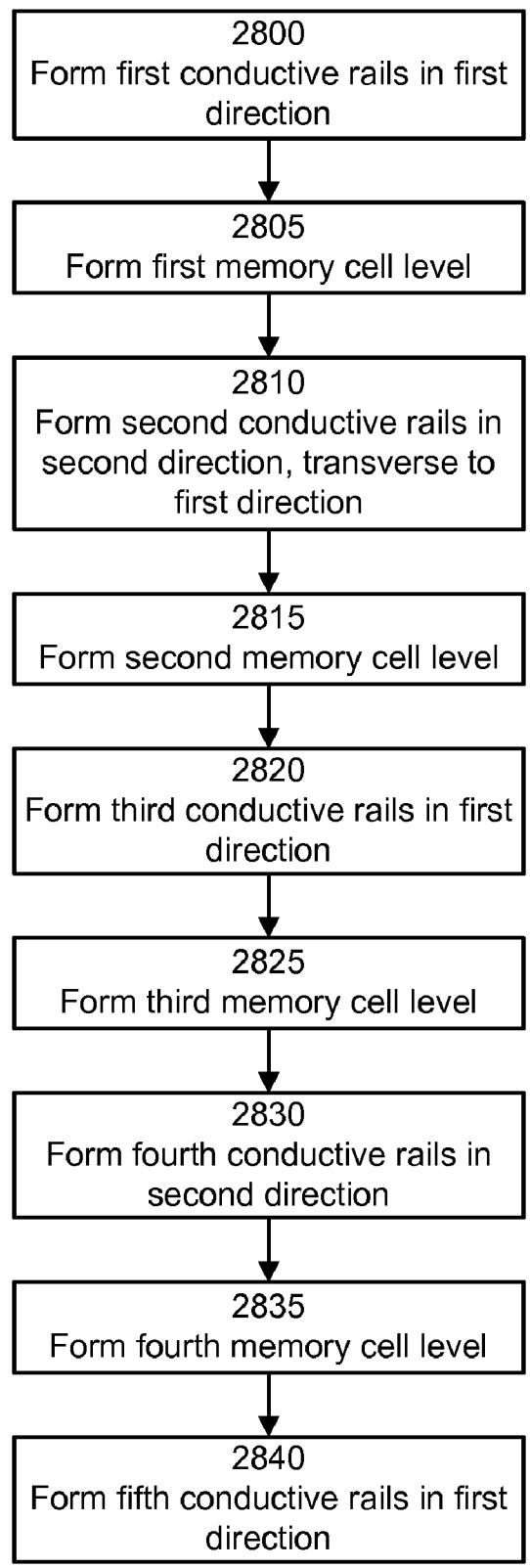
FIG. 28 depicts a process for fabricating a 3-D memory device.

FIG. 28 depicts a process for fabricating a 3-D memory device. Refer also to FIG. 2b. Step 2800 includes forming first conductive rails in a first direction, e.g., at the bottom of L0. Step 2805 includes forming a first memory cell level, e.g., in L0. Step 2810 includes forming second conductive rails in a second direction, transverse to the first direction, e.g., at the top of L0/bottom of L1. Step 2815 includes forming a second memory cell level, e.g., in L1. Step 2820 includes forming third conductive rails in the first direction, e.g., at the top of L1/bottom of L2. Step 2825 includes forming a third memory cell level, e.g., in L2. Step 2830 includes forming fourth conductive rails in the second direction, e.g., at the top of L2/bottom of L3. Step 2835 includes forming a fourth memory cell level, e.g., in L3. Step 2840 includes forming fifth conductive rails in the first direction, e.g., at the top of L3.

Figure 29:
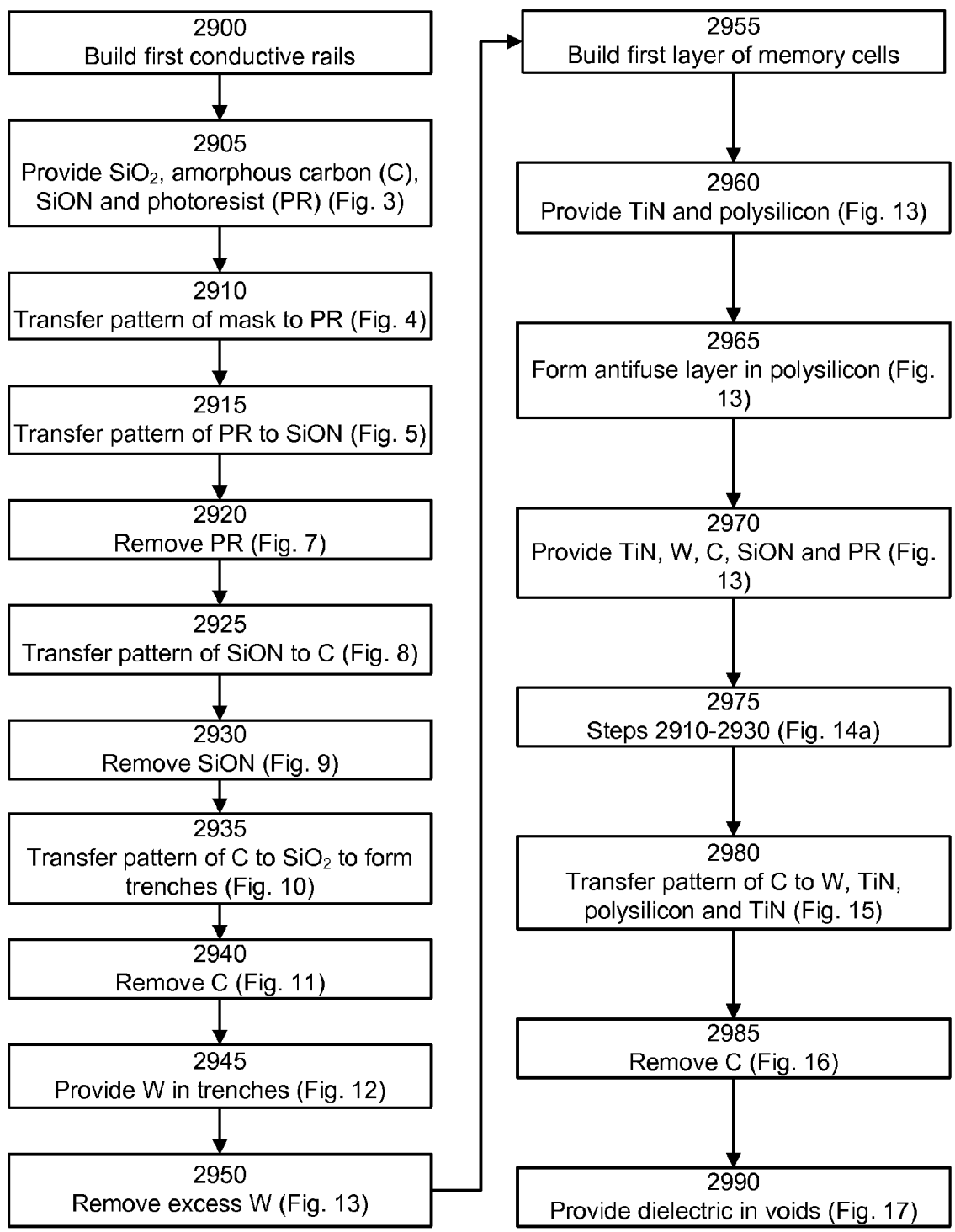
FIG. 29 depicts a process for fabricating a first level of a 3-D memory device.

FIG. 29 depicts a process for fabricating a first level of a 3-D memory device. Refer also to FIGS. 3-17. The process depicted is a general overview as not all details are provided. Step 2900 includes starting to build first conductive rails. Step 2905 includes depositing silicon dioxide, amorphous carbon (C), silicon-oxynitride and photoresist (see FIG. 3). Step 2910 includes transferring a pattern of a photo mask to the photoresist (see FIG. 4). Step 2915 includes transferring a pattern of the photoresist to the silicon-oxynitride (see FIG. 5). Step 2920 includes removing the photoresist (see FIG. 7). Step 2925 includes transferring the pattern of the silicon-oxynitride to the amorphous carbon (see FIG. 8). Step 2930 includes removing the silicon-oxynitride (see FIG. 9). Step 2935 includes transferring the pattern of the amorphous carbon to the silicon dioxide to form trenches (see FIG. 10). Step 2940 includes removing the amorphous carbon (see FIG. 11). Step 2945 includes providing tungsten in the trenches (see FIG. 12). Step 2950 includes removing the excess tungsten (see FIG. 13).

Step 2955 includes starting to build a first layer of memory cells. Step 2960 includes providing titanium nitride and polysilicon layers (see FIG. 13). Step 2965 includes forming an antifuse layer in the polysilicon. Step 2970 includes providing titanium nitride, tungsten, C, silicon-oxynitride and photoresist layers. Step 2975 includes performing steps which are analogous to steps 2910-2930 (see FIG. 14a). Step 2980 includes transferring a pattern of the amorphous carbon to the tungsten, titanium nitride, polysilicon and titanium nitride layers (see FIG. 15). Step 2985 includes removing the amorphous carbon (see FIG. 16). Step 2990 includes providing a dielectric in the voids (see FIG. 17).

Figure 30:
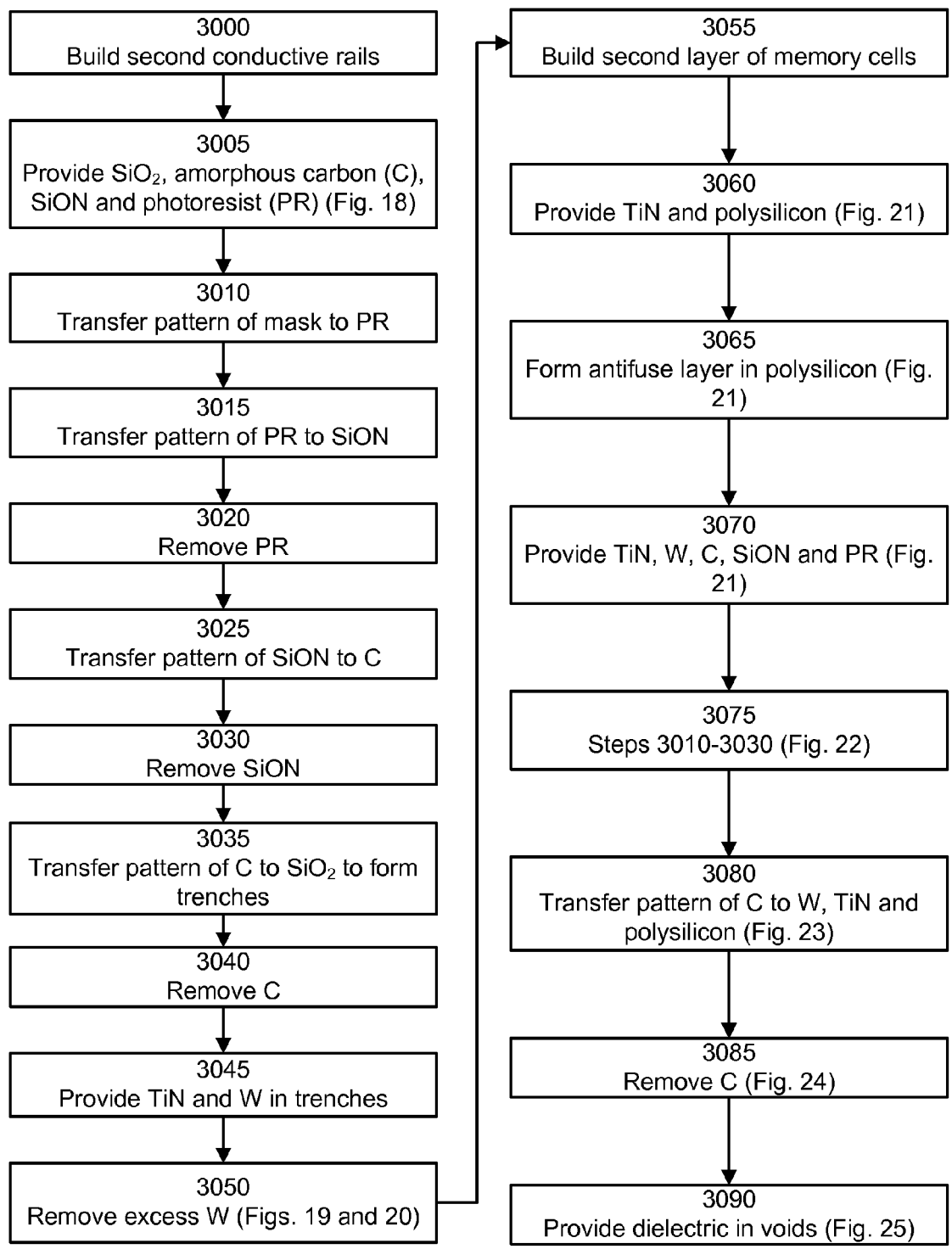
FIG. 30 depicts a process for fabricating a second level of a 3-D memory device.

FIG. 30 depicts a process for fabricating a second level of a 3-D memory device. Refer also to FIGS. 18-25. The process depicted is a general overview as not all details are provided. Step 3000 includes starting to build second conductive rails. Step 3005 includes depositing silicon dioxide, amorphous carbon (C), silicon-oxynitride and photoresist (see FIG. 18). Step 3010 includes transferring a pattern of a photo mask to the photoresist. Step 3015 includes transferring a pattern of the photoresist to the silicon-oxynitride. Step 3020 includes removing the photoresist. Step 3025 includes transferring the pattern of the silicon-oxynitride to the amorphous carbon. Step 3030 includes removing the silicon-oxynitride. Step 3035 includes transferring the pattern of the amorphous carbon to the silicon dioxide to form trenches. Step 3040 includes removing the amorphous carbon. Step 3045 includes providing titanium nitride and tungsten in the trenches. Step 3050 includes removing the excess tungsten (see FIGS. 19a and 20).

Step 3055 includes starting to build a second layer of memory cells. Step 3060 includes providing titanium nitride and polysilicon layers (see FIG. 21). Step 3065 includes forming an antifuse layer in the polysilicon. Step 3070 includes providing titanium nitride, tungsten, amorphous carbon, silicon-oxynitride and photoresist layers. Step 3075 includes performing steps which are analogous to steps 3010-3030 (see FIG. 22). Step 3080 includes transferring a pattern of the amorphous carbon to the tungsten, titanium nitride and polysilicon layers (see FIG. 23). Step 3085 includes removing the amorphous carbon (see FIG. 24). Step 3090 includes providing a dielectric in the voids (see FIG. 25).

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for fabricating a 3-D monolithic memory device, comprising:

patterning a first silicon-oxynitride layer in a layered structure to provide a first patterned silicon-oxynitride layer, the layered structure includes a first amorphous carbon layer below the first silicon-oxynitride layer, and a first oxide layer below the first amorphous carbon layer;

patterning the first amorphous carbon layer using the first patterned silicon-oxynitride layer to provide a first patterned amorphous carbon layer;

patterning the first oxide layer using the first patterned amorphous carbon layer to provide a first patterned oxide layer;

forming a first set of conductive rails in the first patterned oxide layer, the first set of conductive rails is in a particular level of the 3-D monolithic memory device;

forming a first polycrystalline layer above the first set of conductive rails;

patterning the first polycrystalline layer to provide a first plurality of pillars which are electrically coupled from below to the first set of conductive rails, the first plurality of pillars comprise diodes in the particular level of the 3-D monolithic memory device;

forming a second oxide layer above the first plurality of pillars, a second amorphous carbon layer above the second oxide layer, and a second silicon-oxynitride layer above the second amorphous carbon layer;

patterning the second silicon-oxynitride layer to provide a second patterned silicon-oxynitride layer;

patterning the second amorphous carbon layer using the second patterned silicon-oxynitride layer to provide a second patterned amorphous carbon layer;

patterning the second oxide layer using the second patterned amorphous carbon layer to provide a second patterned oxide layer; and forming a second set of conductive rails in the second patterned oxide layer, the first plurality of pillars are electrically coupled from above to the second set of conductive rails.

2. The method of claim 1, wherein:
the first oxide layer comprises silicon dioxide.

3. The method of claim 1, wherein:
each pillar of the first plurality of pillars has a heavily doped region of a first conductivity type, an undoped or lightly doped middle region, and a heavily doped region of a second conductivity type.

4. The method of claim 1, wherein:
the first silicon-oxynitride layer has a starting thickness of about 220 to 420 Angstroms; and
the first amorphous carbon layer has a starting thickness of approximately 2700 to 3300 Angstroms.

5. The method of claim 1, wherein:
the patterning of the first oxide layer using the first patterned amorphous carbon layer to provide the first patterned oxide layer includes patterning one or more intermediate layers using the first patterned amorphous carbon layer and patterning the first oxide layer using the one or more intermediate layers.

6. The method of claim 1, further comprising:
patterning a polycrystalline layer above the second set of conductive rails to form a second plurality of pillars which are electrically coupled from below to the second set of conductive rails.

7. The method of claim 1, further comprising:
the first patterned oxide layer is provided by forming parallel trenches in the first oxide layer.

8. The method of claim 1, further comprising:
the 3-D monolithic memory device comprises multiple levels of diodes.

9. The method of claim 1, further comprising:
the first set of conductive rails is formed in the first patterned oxide layer by filling the parallel trenches with a conductive material.

10. The method of claim 9, wherein:
the conductive material comprises at least one of tungsten and aluminum titanium nitride.

* * * * *